United States Patent [19]

Römer et al.

[11] Patent Number: 5,019,425

[45] Date of Patent: May 28, 1991

[54] PROCESS FOR THE PRE-TREATMENT OF SYNTHETIC MATERIALS

[75] Inventors: Michael Römer; Ludwig Stein, both of Berlin, Fed. Rep. of Germany

[73] Assignee: Schering Aktiengesellschaft, Berlin and Bergkamen, Fed. Rep. of Germany

[21] Appl. No.: 275,712

[22] Filed: Nov. 23, 1988

[30] Foreign Application Priority Data

Nov. 25, 1987 [DE] Fed. Rep. of Germany ....... 3740369

[51] Int. Cl.$^5$ .............................................. B05D 3/10
[52] U.S. Cl. .................................... 427/305; 156/668; 427/96; 427/98; 427/304; 427/306; 427/307; 427/444
[58] Field of Search ............................... 427/304–307, 427/98, 96, 444; 156/668

[56] References Cited

U.S. PATENT DOCUMENTS

| | | | |
|---|---|---|---|
| 3,317,330 | 5/1967 | Livingston et al. | 156/668 |
| 3,361,589 | 1/1968 | Lindsey et al. | 156/668 |
| 3,574,070 | 4/1971 | Sahely | 427/307 |
| 3,791,848 | 2/1974 | DeAngelo | 427/307 |
| 4,089,704 | 5/1978 | Heiss et al. | 156/668 |
| 4,339,340 | 7/1982 | Muraoka | 156/668 |
| 4,411,735 | 10/1983 | Belani | 156/668 |
| 4,686,002 | 8/1987 | Tasset | 156/668 |
| 4,775,557 | 10/1988 | Bastenbeck et al. | 427/307 |
| 4,820,553 | 5/0189 | Walsh | 427/307 |

*Primary Examiner*—Janyce Bell
*Attorney, Agent, or Firm*—Michael J. Striker

[57] ABSTRACT

The invention concerns a process disclosed for the pretreatment of synthetic materials (plastics), particularly polyetherimide, polycarbonate and poly(ester-co-carbonate), for the adhesive chemical metallization, involving treating the synthetic material with a quaternary base dissolved in an organic solvent.

22 Claims, No Drawings

PROCESS FOR THE PRE-TREATMENT OF SYNTHETIC MATERIALS

BACKGROUND OF THE INVENTION

The invention concerns a process for the pre-treatment of synthetic materials, in particular polyetherimide, polycarbonate and polyester-co-carbonate, for adhesive chemical metallization.

The term "pre-treatment" is used in this context to mean the preparation or alteration of the synthetic material surfaces, exclusive of fillers (such as e.g. glass fibers), the object being to guarantee a complete and uniform activation and to thereby positively influence the chemical metallization.

The pre-treatment of synthetic materials based upon polyesters, polyamides, polysulfones, polyurethanes among other is already known for subsequent chemical metallization. Known treatments include, for example, the treatment by means of alkaline cleaners, by means of $SO_3$ in the gaseous phase, by means of wetting agent-containing solvent or by means of water-soluble organic dissolvers which solvate the hydroxyl ions.

However, these treatment techniques are unsuitable for the pre-treatment of synthetic materials based upon polyetherimides, polycarbonates and polyester-co-carbonate, since they promote only an unsatisfactory adhesiveness of the deposited metal layers.

SUMMARY OF THE INVENTION

It is therefore an object of the present invention to make available a pre-treatment technique for synthetic materials of the above mentioned type which makes possible a satisfactory adhesive chemical metallization.

This object is attained according to the present invention by a process for the pre-treatment of synthetic materials, particularly polyetherimide, polycarbonate and polyester-co-carbonate, for adhesive chemical metallization, in which a quaternary base dissolved in an organic solvent is applied onto a synthetic material.

Advantageous specific embodiments include selection of the quaternary base from quaternary ammonium-, phosphoniumor- or arsonium hydroxide.

Alternatively, the quaternary base may preferably be selected from among $C_1$-$C_4$-alkyl-ammonium hydroxide, arylammonium hydroxide, vinyl triarylphosphonium hydroxide, tetraphenylphosphonium hydroxide and tetraphenylarsonium hydroxide.

One of the most preferred quaternary bases according to the present invention is tetramethylammonium hydroxide.

The quaternary base may be formed from its salt in the presence of hydroxyl ions. In this case, the salt is usually the halogenide, tetrafluoro(hydro, phenyl)borate, periodate, hydrosulfate, dihydrogen phosphate or hexafluorophosphate. Insofar as the hydroxyl ions, these can be formed from alkali hydroxides.

The organic solvent according to the present invention is preferably a solvent which is soluble in water, alcohol or ether.

Expeditiously, the organic solvent may simultaneously function as swelling means for the synthetic material employed.

Suitable examples of organic solvents according to the invention include by way of example, alkyl sulfoxide, dialkyl sulfoxide, dialkyl carbonate, dialkyl acetamide, N, N-dialkyl formamide, pyrrolidone, alcohol and ether.

The organic solvent may be employed in mixture with water.

Depending upon the specific material being treated, the metal to applied, the shape and function of the synthetic material, a pre-treatment-effective amount of the solvent and base may vary broadly. Preferably, the quaternary base is employed in a concentration from 0.05 to 200 g/liter. The organic solvent is preferably employed in a concentration from 10 to 100 percent by weight.

The most suitable temperature for the pre-treatment of the synthetic material is about 25° C., with a preferred range from between about 15° to 30° C.

According to a particular embodiment, the pre-treatment also includes a roughening of the synthetic material by means of an etching bath, preferably containing acid oxidation agent. Alternatively, the etching bath preferably contains a sulfuric acid chromium-VI-oxide.

Typically, after the pre-treatment, the synthetic material is activated in known manner, e.g. by means of a solution containing colloidal or ionogenic palladium, with the palladium having been freed of protective colloids or reduced to the zero-valent metal.

Then, the chemical metallization generally follows by means of copper, silver, gold, tin, cobalt or nickel bath.

The synthetic material itself is composed in particular of amorphic, aromatic, high-temperature-resistant thermoplastic polyetherimide.

When the material is based upon polycarbonate, it is preferably an amorphic, thermoplastic bisphenol A-polycarbonate.

When the material is based upon a polyester-co-carbonate, it is preferably a thermoplastic bisphenol A-polycarbonate with copolymers bisphenol A-ethylene terephthalate or butylene terephthalate.

With regard to form, any form of synthetic materials may be used according to the present invention, although the most typical pieces are foils, spray components, copper-laminated extruded plates or shaped pieces.

The most common utility of the present process is in the manufacture of conductor plates (so-called printed circuits).

The process according to the present invention makes possible in particularly advantageous manner an adhesive metallization of synthetic material surfaces.

The synthetic materials, in surprising manner, are strongly hydrophilized and thereby in particular manner prepare for the activation, whereby simultaneously the surfaces are swollen and the attack of the etching medium is facilitated and thereby strengthened.

A particularly surprising advantage is that the so-treated surfaces display no microscopically visible roughness, which positively influences the electrical surface characteristics.

As polyetherimide is understood a thermoplastic, aromatic, ether group-containing polyimide which contains periodic, repeating aromatic and aromatically substituted phthalic acid imide groups in the chain.

Synthetic materials designated as polycarbonate are such which are customarily synthesized from substituted or unsubstituted bisphenol A and phosgene.

Polyester-co-carbonate are considered as further developed polycarbonates, which are composed from the long bisphenol A-PC segments and shorter bisphenol A-ethylene- or butylene-terephthalate segments.

These synthetic materials can, if desired, contain a glass fiber portion or mineral portion.

Quaternary bases useful according to the present invention include, in particular:
Alkylammonium hydroxide,
Arylammonium hydroxide,
Vinyltriarylphosphonium hydroxide,
Tetraphenylphosphonium hydroxide and
Tetraphenylarsonium hydroxide.

An outstanding activity is provided, moreover, by tetramethylammonium hydroxide.

Further suitable compounds include, moreover, the following bases or their salts, which are employed together with hydroxyl ions:
Alkylbenzyldimethylammonium chloride
(−)-N-benzylquininium chloride,
Benzyltributylammonium bromide,
Benzyltributylammonium chloride,
Benzyltriethylammonium chloride,
Benzyltriethylammonium hydroxide,
Benzyltrimethylammonium chloride,
Benzyltrimethylammonium hydroxide,
Butyltriphenylphosphonium chloride,
(−)-N-dodecyl-N-methylephedrinium bromide,
Ethylhexadecyldimethylammonium bromide,
Ethyltrioctylphosphonium bromide,
Hexadecyltrimethylammonium bromide,
Hexadecyltrimethylammonium chloride,
Methyltrioctylammonium chloride,
Tetrabutylammonium fluoride trihydrate,
Tetrabutylammonium hydrogen sulfate,
Tetrabutylammonium hydroxide,
Tetrabutylammonium iodide,
Tetrabutylammonium tetrafluoroborate,
Tetrabutylphosphonium bromide,
Tetrabutylphosphonium chloride,
Tetraethylammonium bromide,
Tetraethylammonium chloride,
Tetraethylammonium cyanide,
Tetraethylammonium hydroxide,
Tetraethylammonium fluoroborate,
Tetraoctylammonium bromide,
Tetraphenylphosphonium bromide,
Tetraphenylphosphonium chloride,
Tetrapropylammonium bromide,
Tributylhexadecylphosphonium bromide,
Tributylmethylammonium chloride,
Tetrapentylammonium bromide,
Tetramethylammonium hydroxide,
Tetrapropylammonium hydroxide (aqueous solution),
Tetrahexylammonium bromide,
Tetradecyltrimethylammonium bromide and
Methyltridecylammonium chloride.

The use of these compounds is at concentrations from 0.05 to 200 g/liter.

It should be understood that the pre-treatment composition according to the present invention can be employed in its original form or, if desired, in the form of the salt in the presence of hydroxyl ions, from which the quaternary base is set free in the presence of hydroxyl ions.

Useful as organic solvent or solution-promoting media, the following are mentioned by way of example:
N-methyl formamide,
N-methyl acetamide,
Propylene carbonate,
Ethylene carbonate,
Acetonitrile,
Dimethylsulfoxide,
N,N-dimethylformamide,
Dimethylacetamide,
N-methyl pyrrolidon,
Methylene chloride,
Acetic acid ethyl ester,
1,4-dioxan,
Diethylcarbonate,
γ-butyrolactone,
Ethylene glycol,
Ethylene glycol monomethylether,
Ethylene glycol monoethylether,
Ethylene glycol monobutylether,
Ethylene glycol monoisopropylether,
Ethylene glycol monoisobutylether,
Ethylene glycol mono-tert.-butylether,
Ethylene glycol mono-n-hexylether,
Ethylene glycol mono(2-aminoethyl)-ether,
Ethylene glycol diglycidylether,
Ethylene glycol monophenylether,
Ethylene glycol monoacetate,
Ethylene glycoldiacetate,
Ethylene glycol monoethylether-acetate,
Ethylene glycol monoallylether,
Ethylene glycol dimethylether,
Ethylene glycol monobutylether-acetate,
Ethylene glycol monobenzylether,
Ethylene glycol monoisoamylether,
Methanol,
Ethanol,
n-Propanol,
i-Propanol,
n-Butanol,
Glycerin,
Glycerinaldehyde,
Glyceringlycide,
Glycerin monomethylether,
Glycerin monoethylether,
Diethylene glycol,
Diethylene glycol monomethylether,
Diethylene glycol monoethylether,
Diethylene monobutylether,
Diethylene diethylether,
Diethylene glycol dimethylether,
Triethylene glycol,
Triethylene glycol monomethylether, and
Triethylene glycol monoethylether.

The solvent is expediently employed in concentrations from 10 to 100 percent by weight.

If desired, a mixture of the solvent with water may be employed.

The solutions to be used according to the present invention are alkaline and display a pH-value from 13 to 14.

Treatment of the synthetic material follows, preferably, at temperatures from 15° to 30° C., with 25° C. particularly preferred.

The process according to the present invention is performed in general by means of customary immersion of the synthetic material workpiece, such as e.g. foils, spray parts, copper-laminated extruded plates or shaped parts, into the pretreatment solution according to the present invention.

The duration of treatment depends upon the particular synthetic material, and amounts as a rule from 3 to 10 minutes, preferably 5 minutes.

The pre-treated parts are then rinsed, and are ready for further working-up. Water no longer beads off from a workpiece so pre-treated.

The activation and chemical metallization of the synthetic material workpieces pre-treated according to the present invention follows in known manner.

For example, the activation can be performed by means of a palladium activator, which is provided in either ionogenic form or in the form of colloidal particles. If necessary, the palladium ions are reduced on the surface of the substrate, for example by means of the penetration of dimethylaminoboran or sodium borohydride. Colloidal palladium seed can be freed of its protective colloid by means of hydroborofluoric acid or caustic soda.

The so-pre-treated surfaces are then chemically metallized by customary techniques, and indeed by the use of electroless nickel, cobalt, silver, tin, gold or copper baths. The synthetic material substrate, chemically coppered or nickeled, for example, can be subjected to a temperature from 80° to 120° C. for the purpose of strengthening the bond, if necessary, to remove water or solvent, for a period which can run about one hour.

Depending in each case upon the requirements for the metallized synthetic material substrate, the layer thickness of the metal can be reinforced chemically or galvanically and can be worked-up according to customary structuralization techniques. The composite metal-synthetic material distinguishes by its high degree of stability and adhesiveness of the metal layer on the substrate surface.

The process according to the present invention can be employed in particular for the manufacture of conductor plate (printed circuits) in electrical engineering and electronics.

Conductor plates produced according to the present process possess the particular advantage of low micro-roughness and high adhesiveness, which is of great technical advantage.

A particularly good adhesion even after the soldering operation can be obtained when the synthetic material is roughened after the pre-treatment by means of an etching bath, preferably by means of a bath containing an acid oxidation agent, and then further treated in customary manner. In addition to chromium sulfuric acid, also hydrochloric acid, hydrogen peroxide and peroxidisulfuric acid can be employed as oxidation agent.

The known synthetic material workpieces display extraordinarily high adhesive values up to 20 N/cm according to the present invention.

The novel features which are considered characteristic for the invention are set forth in particular in the appended claims. The invention itself, however, both as to its construction and its method of operation, together with additional objects and advantages thereof, will be best understood from the following descriptions of specific embodiments.

DESCRIPTION OF THE PREFERRED EMBODIMENTS

Example 1

A polyetherimide plate with 20% glass fiber portion is immersed in a solution of 40 g/liter tetraethylammonium hydroxide in diethylene glycol monobutylether/N-methyl-pyrrolidon (60:40) for a period of 5 minutes at room temperature, then rinsed, and then immersed for 5 minutes at room temperature in a customary alkaline cleaner for the conductor plate metallization.

Thereafter, the plate is rinsed and activated in a palladium activator, and the palladium ions are then reduced to palladium metal in a reducing bath. Afterwards, the so-pretreated plate is provided with a thin copper layer in a chemical reductive copper bath, tempered, and galvanically supplemented with copper to a 35 μm layer thickness. This is followed by a tempering for 2 hours at 132° C. The adhesive value measured according to German Industrial Standard DIN-Norm 53 494 amounts to 12–13 N/cm before the soldering, and 10 N/cm after immersing the plate for 5 seconds in a 265° C. hot tin/lead soldering bath.

Example 2

A polyether imide plate with 20% glass fiber portion after drying and relaxation for 4 hours at a temperature of 160° C., is treated for a period of 5 minutes in a 50° C. hot solution composed of 80 g/liter tetramethylammonium hydroxide, 900 ml acetonitrile, 50 ml methanol and 50 ml water. The plate is then rinsed for 3 minutes and, as described in Example 1, alkalinically cleaned, activated, chemically and galvanically metallized and tempered. The adhesive value, determined as in Example 1, amounts to 12–13 N/cm before the soldering, and 10 N/cm after immersion of the plate for 5 seconds in a 265° C. hot lead/tin soldering bath.

Example 3

Polyetherimide plates with 20% glass fiber portion are treated in solutions as described in Example 2, containing however, instead of acetonitrile, the following organic compounds in the same concentration range:
a) 900 ml N,N-dimethylacetamide,
b) 900 ml N-methylpyrrolidon,
c) 900 ml N,N-dimethylformamide.

The polyetherimide plates are then rinsed and, analogous to Example 2, further worked up. The adhesive values, measured according to the Peel Test, German Industrial Norm DIN-Norm, are set forth in the following table:

| (a) N,N-dimethylacetamide | 20 N/cm |
|---|---|
| (b) N-methylpyrrolidon | 20 N/cm |
| (c) N,N-dimethylformamide | 15 N/cm |

Example 4

Each polycarbonate plate with TiO$_2$ pigmentation is treated for 5 minutes in a 50° C. hot solution composed of
a) 40 g/liter tetramethylammonium hydroxide
800 ml ethylene glycol monobutylether
150 ml N,N-dimethylacetamide
50 ml water
or
b) 40 g/liter tetramethylammonium hydroxide
800 ml diethylene glycol monobutylether
150 ml diethyl carbonate
50 ml water.

After 3 minutes' rinsing in water, the plates are immersed in a customary sulfuric acid chromium-VI-oxide mordant, rinsed for 2 minutes, and the still remaining hexa-valent chromium on the substrate surface is reduced to chromium-III by means of a 2% aqueous NaHSO$_3$ solution.

The substrate surface of the plates is slightly roughened after the treatment in both Examples, and allows a good wetting with water. Both plates are activated as described in Example 1 with a palladium activator, and then chemically coppered to 1 μm layer thickness in a customary thick copper bath. After tempering the polycarbonate plates for one hour at 100° C., the respective copper layers possess their adhesive values as from the Tesa-Test.

Example 5

A polyester-co-carbonate-plate is treated for 2 minutes at room temperature in a solution containing 20 g/liter potassium hydroxide and 20 g/liter tetraphenylphosphonium bromide dissolved in 950 ml diethylene glycol monomethylether. The plate is rinsed for 3 minutes in water, alkalinically cleaned, activated with palladium seeds, chemically and galvanically supplemented with copper and tempered in the manner as described in Example 1. The Tesa-Test is performed after a 1 hour tempering of the metallized plate at 100° C.

An analogously treated plate of a polyetherimide with 20% glass fiber portion displays an adhesive value according to German Industrial Standard DIN-Norm of 16 N/cm before the soldering, and 13 N/cm after immersing the sample for 5 seconds in a 265° C. hot solder.

Example 6

A polyetherimide plate with 20% glass fiber portion is immersed for 5 minutes in a solution composed of 80 g/liter tetramethylammonium hydroxide and 400 ml diethylene glycol monobutylether, then rinsed, and metallized up to a layer thickness of 35 μm copper, in a manner similar to that set forth in Example 1. The adhesion according to German Industrial Norm DIN-Norm amounts to 14 N/cm.

Example 7

A polyetherimide plate with 20% glass fiber portion is immersed for 5 minutes in a solution composed of 60 g tetramethylammonium hydroxide, 400 ml ethylene glycol monobutylether 400 ml dimethylsulfoxide and 200 ml methanol. It is then rinsed and—analogous to Example 1—metallized to 35 μm copper. The adhesion measured according to German Industrial Norm DIN-Norm amounts to 20 N/cm.

Example 8

A polyetherimide plate with 20% glass fiber portion is immersed
a) 5 minutes in a solution composed of 80 g/liter tetramethylammonium hydroxide in diethylene glyco monobutylether or
b) 3 minutes in a solution of 60 g tetramethylammonium hydroxide in 400 ml dimethylsulfoxide and 200 ml methanol.

Then follows rinsing for 5 minutes and treatment in a chromium-VI-oxide-sulfuric acid mordant for 15 minutes at 65° C., rinsing again for 2 minutes, and thereafter the remaining excess hexa-valent chromium is reduced to tri-valent chromium by means of a 10% aqueous solution of $NaHSO_3$. The substrate surface of both (differently treated) plates is not substantially roughened and displays excellent wetting with water. Both plates are activated with palladium seeds as described in Example 1, and then metallized to 0.4 m layer thickness in a customary chemical copper bath. Tempering follows for one hour at 100° C., and then galvanic supplementation with copper to 35 μm layer strength over the entire surface. After a further tempering for 2 hours at 130° C., a 2.54 cm wide strip is cut from each of the plates, and the adhesive values are determined according to German Industrial Norm DIN-Norm.

The adhesive values obtained are:
treatment a): 13.5 N/cm before the soldering and
treatment b): 17 N/cm.

After immersing the plates for 5 seconds in a 265° C. hot solder bath, the adhesion is 12 N/cm (for treatment a)) and 15 N/cm (for treatment b)).

Example 9

A polyester-co-carbonate-plate, displaying a bending modulus of 1900 N/mm$^2$, is immersed for 2 minutes in a solution of 8 g tetramethylammonium hydroxide in 400 ml acetonitrile, 400 ml water and 200 ml methanol, rinsed for 3 minutes and treated in a customary chromium-sulfuric acid mordant concentrated with 380 g/liter $CrO_3$ and 380 g/liter sulfuric acid for 10 minutes. After 2 minutes' rinsing with water, and 3 minutes' immersion in a 10% sodium hydrogen sulfite solution, then repeated rinsing for 5 minutes, the polyester-co-carbonate-plate is immersed in a customary acid palladium-tin chloride activator, after-treated in customary manner, rinsed again and then metallized to 1 μm layer thickness in a chemical nickel bath at 55° C.

The plate so obtained, nickeled over the entire surface, after tempering for 2 hours at 130° C., is galvanically supplemented with copper to a layer thickness of 35 μm, and the adhesive value is determined to be 10.6 N/cm according to German Industrial Standard DIN-Norm.

It will be understood that each of the elements described above, or two or more together, may also find a useful application in other types of compositions differing from the types described above.

While the invention has been illustrated and described as embodied in a process for the pre-treatment of synthetic materials, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. Process for pretreatment of a synthetic material selected from the group consisting of polyetherimide, polycarbonate and polyester-co-carbonate for adhesive chemical metallization, comprising the step of applying from 0.05 to 200 gm/l of a quaternary base having a pH value of 13-14 dissolved in an organic solvent selected from the group consisting of water-soluble organic solvents, alcohol-soluble organic solvents and ether-soluble organic solvents onto said material selected from the group consisting of polyetherimide, polycarbonate and polyester-co-carbonate, said quaternary base being selected from the group consisting of quaternary phosphonium and quaternary arsonium hydroxides, so that said metallization provides an adherent metal layer on said material.

2. The process according to claim 1, wherein said quaternary base is selected from the group consisting of vinyl triarylphophonium hydroxide, tetraphenylphosphonium hydroxide and tetraphenylarsonium hydroxide.

3. The process according to claim 1, further comprising said quaternary bases is formed from its salt in the presence of hydroxyl ions.

4. The process according to claim 3, wherein said salt comprises a salt selected from the group consisting of the halogenide, tetrafluoro(hydro, phenyl)borate, periodate, hydrosulfate, dihydrogen phosphate and hexafluorophosphate.

5. The process according to claim 1, wherein said organic solvent simultaneously comprising swelling means for said synthetic material.

6. The process according to claim 1, wherein said organic solvent is selected from the group consisting of alkyl sulfoxides, dialkyl sufoxides, dialkyl carbonates, dialkyl acetamides, N,N-dialkyl formamides, pyrrolidones, acetonitrile, methanol, ethanol, propanols, butanols, glycerins, ethylene glycols, ethers of ethylene glycol, diethylene glycols and ethers of diethylene glycol.

7. The process according to claim 1, wherein said organic solvent is employed in mixture with water.

8. The process according to claim 1, wherein said organic solvent is employed in a concentration of at least 10 percent by weight.

9. The process according to claim 1, further comprising said applying is performed at a temperature from 15° to 30° C.

10. The process according to claim 9, wherein said temperature is 25° C.

11. The process according to claim 1, further comprising the step of roughening said synthetic material by contacting with an etching bath.

12. The process according to claim 11, wherein said etching bath comprises a bath containing acid oxidation agent.

13. The process according to claim 11, wherein said etching bath comprises a bath containing a sulfuric acid chromium-VI-oxide.

14. The process according to claim 1, further comprising after said pre-treatment activating and chemically metallizing.

15. The process according to claim 14, wherein said activating occurs with a solution containing one of colloidal and ionogenic palladium, said palladium being one of freed of protective colloids and reduced to zero-valent metal.

16. The process according to claim 1, wherein said chemical metallization occurs by means of a copper, silver, gold, tin, cobalt or nickel bath.

17. The process according to claim 1, wherein said polyetherimide is amorphic, aromatic, high-temperature-resistant and thermoplastic.

18. The process according to claim 1, wherein said polycarbonate is an amorphic, thermoplastic bisphenol A-polycarbonate.

19. The process according to claim 1, wherein said polyester-co-carbonate is a thermoplastic bisphenol A-polycarbonate with copolymers selected from the group consisting of bisphenol A-ethylene terephthalate and bisphenol A-butylene terephthalate.

20. The process according to claim 1, further comprising providing said synthetic material as a foil, copper-laminated extruded plate or shaped piece.

21. A process for making conductor plates comprising the step of adhesive chemical metallization of a synthetic material selected from the group consisting of polyetherimide, polycarbonate and polyester-co-carbonate according to claim 1.

22. Process for pretreatment of a material selected from the group consisting of polyetherimide, polycarbonate and polyester-co-carbonate for adhesive chemical metallization, comprising the step of applying onto said material selected from the group consisting of polyetherimide, polycarbonate and polyester-CO-carbonate from 0.05 to 200 g/l of a quaternary base having a pH value of 13-14 selected from the group consisting of vinyltriarylphosphonium hydroxide, tetraphenylphosphonium hydroxide and tetraphenylarsonium hydroxide dissolved in a solvent containing at least one member selected from the group consisting of acetonitrile, N-methyl formamide, N-methyl acetamide, N,N-dialkyl formamides, dialkyl acetamides, dialkyl carbonates, dimethyl sulfoxide, dialkyl sulfoxides, alkyl sulfoxides, N-methyl pyrrolidone, diethylene glycol monomethylether, diethylene glycol monoethyl ether, diethylene glycol, diethylene glycol monobutylether, ethylene glycol monobutylether, ethylene glycol monoethylether, ethylene glycol monobutylether, ethylene glycol and mixtures thereof with water, so that said metallization provides an adherent metal layer on said polyetherimide.

* * * * *